United States Patent [19]

Kishi et al.

[11] Patent Number: 4,755,666
[45] Date of Patent: Jul. 5, 1988

[54] PHOTOSENSOR FRAME

[75] Inventors: Yasuo Kishi, Hirakata; Hitoshi Kishi, Neyagawa, both of Japan

[73] Assignee: Sanyo Electric Co., Ltd., Moriguchi, Japan

[21] Appl. No.: 63,241

[22] Filed: Jun. 15, 1987

[30] Foreign Application Priority Data

Jun. 16, 1986 [JP] Japan ............................. 61-139621
Jun. 16, 1986 [JP] Japan ............................. 61-91594[U]

[51] Int. Cl.$^4$ ............................................. H01J 5/02
[52] U.S. Cl. ........................................ 250/226; 250/239
[58] Field of Search ............... 250/211 R, 216, 239, 250/226, 578; 357/30

[56] References Cited

U.S. PATENT DOCUMENTS

| | | | |
|---|---|---|---|
| 3,683,192 | 8/1972 | Jacobs | 250/239 |
| 4,309,605 | 1/1982 | Okabe | 250/239 |
| 4,600,833 | 7/1982 | Shibata et al. | 250/216 |
| 4,667,092 | 5/1987 | Ishihara | 250/216 |

FOREIGN PATENT DOCUMENTS

| | | |
|---|---|---|
| 31585 | 2/1983 | Japan . |
| 197783 | 11/1983 | Japan . |
| 148372 | 8/1984 | Japan . |

*Primary Examiner*—David C. Nelms
*Assistant Examiner*—Stephone B. Allen
*Attorney, Agent, or Firm*—W. G. Fasse; D. H. Kane, Jr.

[57] ABSTRACT

A photosensor comprises a frame for shielding of light having a front window and a back entrance, and a photoelectric conversion device including a transparent substrate on a front face thereof. The photoelectric conversion device is fitted in the frame through the back entrance to cause the substrate to face the window and is fixed by one or more stop portions formed by deformation of a surrounding end portion of the back entrance.

16 Claims, 2 Drawing Sheets

PHOTOSENSOR FRAME

BACKGROUND OF THE INVENTION

1. Field of the Invention

The present invention relates to a photosensor and particularly to a framing of a photosensor.

2. Description of the Prior Art

A photosensor in which a photoelectric conversion device in the form of a film is provided on a transparent support substrate is disclosed for example in Japanese Patent Laying-Open Gazette No. 31585/1983. This photoelectric conversion device requires a support substrate since it is formed as a film. A transparent substrate of a plate such as glass or plastic can be provided on a front face of a photoelectric conversion device on which light is incident, whereby the front face of the photoelectric conversion device can be protected. It is found that light is introduced to such a photoelectric conversion device not only through a major surface of the substrate but also through narrow lateral faces parallel to the direction of the thickness thereof. In consequence, in order to intercept light on the lateral faces of the substrate, a protection film of colored resin for protection of the back face of the photoelectric conversion device extends to also cover the lateral faces of the substrate.

However, it is difficult to automatically effect work for covering the lateral faces of the substrate when the protection film and coating work has to be done manually in such a conventional device.

On the other hand, in a molding method using dyes, at least a front face of a substrate on which light is incident needs to be selectively exposed and accordingly a manufacturing process is complicated and not practical.

A photosensor having an optical filter for cutting off light in a specified wavelength region such as an infrared (IR) region on a front face of a photoelectric conversion device is disclosed for example in Japanese Patent Laying-Open Gazette No. 197783/1983. In the photosensor disclosed in this Gazette, the photoelectric conversion device is formed by using single crystal silicon whose spectrum sensitivity region covers not only a visible region but also the infrared region, and accordingly an IR cut-off filter is needed if only light in the visible region is to be measured.

On the other hand, the above mentioned Japanese Patent Laying-Open Gazette No. 31585/1983 discloses a photosensor having a photoelectric conversion device using amorphous silicon whose spectral sensitivity region almost coincides with the visible region as shown in FIG. 5. In addition, a color sensor in which blue, green and red color filters are disposed on a front face of a photoelectric conversion device using amorphous silicon is disclosed in Japanese Patent Laying-Open Gazette No. 148372/1984. In such a photoelectric conversion device using amorphous silicon, a spectral sensitivity region almost coincides with the visible region as described above. However, boundary regions of the spectral sensitivity region slightly extend into the infrared (IR) region or an ultraviolet (UV) region and accordingly, in order to measure light only in the visible region with precision, an IR cut-off filter and a UV cut-off filter are required.

If such an optical cut-off filter is fixed by an adhesive agent on a light admitting face of a support substrate directly or through a color filter, the cut-off filter is sometimes detached or broken in a heat cycle test or a humidity test. Consequently, such conventional sensors have little reliability and cannot be practically utilized.

SUMMARY OF THE INVENTION

In view of the above described prior techniques, an object of the present invention is to provide a framed photosensor in which light is prevented from being penetrated into a photoelectric conversion device through narrow lateral faces of a transparent support substrate parallel to the thickness direction of the substrate.

Another object of the present invention is to provide a framed photosensor in which an optical cut-off filter is provided on a front face of a substrate, on which light is incident, and the filter is never detached nor broken in a heat cycle test or a humidity test.

According to an aspect of the present invention, a photosensor comprises: a light shielding frame having a front window and a back entrance; and a photoelectric conversion device including a transparent substrate on a front face, the photoelectric conversion device being fitted in the frame through the back entrance so as to cause the substrate to face the window, and the photoelectric conversion device being fixed by one or more stop portions provided by deformation of a surrounding end portion of the back entrance.

According to another aspect of the present invention, a photosensor comprises: a light shielding frame having a front window and a back entrance; a photoelectric conversion device including a transparent substrate on a front face thereof; and an optical cut-off filter, the filter being fitted in the frame through the back entrance, the photoelectric conversion device being fitted in the frame to cause the substrate and the window to hold the filter therebetween, and the filter being fixed by one or more stop portions provided by deformation of a surrounding end portion of the back entrance.

According to a further aspect of the present invention, a photosensor comprises: a light shielding frame having a front window and a back entrance; and a photoelectric conversion device including a transparent substrate on a front face thereof, the photoelectric conversion device being fitted in the frame through the back entrance to cause the substrate to face the window, and the photoelectric conversion device being fixed at one or more points of the surrounding end portion of the back entrance by an adhesive agent.

These objects and other objects, features, aspects and advantages of the present invention will become more apparent from the following detailed description of the present invention when taken in conjunction with the accompanying drawings.

BRIEF DESCRIPTION OF THE DRAWINGS

In the figures, identical reference characters denote corresponding portions.

DESCRIPTION OF THE PREFERRED EMBODIMENTS

Figure 1:
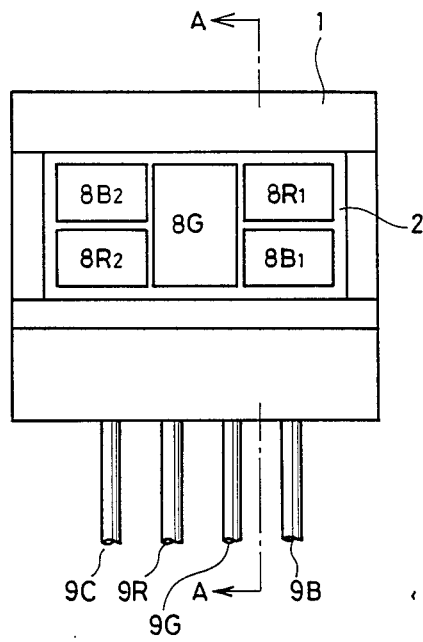
FIG. 1 is a schematic front view of a color sensor of an embodiment of the present invention.

Referring to FIGS. 1 to 4, a color sensor of an embodiment of the present invention will be described. A light shielding frame 1 is formed of a thermoplastic resin such as polycarbonate or polybutylene terephthalate (PBT). The frame 1 has a front window 2 and a back entrance 3 larger than the window 2. A photoelectric conversion device 4 comprises a transparent support substrate 5 of glass or the like and a plurality of film-shaped photoelectric conversion elements 6 formed on a back face of the substrate 5. For example, the photoelectric conversion elements 6 may be formed of amorphous silicon having a spectral sensitivity region almost coincident with the visible region as shown in FIG. 5 and in that case, a semiconductor junction such as p-i-n or $p-n^--n^+$ parallel to a film surface of each element is contained in each of those elements 6.

A color filter plate 7 is adhered fixedly on a front face of the substrate 5 and this color filter plate 7 has optical bandpass filters of red, green and blue colors opposed to the respective photoelectric conversion elements 6. As shown in FIG. 1, a green color filter 8G is disposed at the center, and a pair of red color filters 8R1 and 8R2 and a pair of blue color filters 8B1 and 8B2 are disposed point-symmetrically with respect to the green color filter 8G. The photoelectric conversion elements 6 are five elements corresponding to the respective areas of those bandpass filters. A lead pin 9R is connected to back electrodes of the two photoelectric conversion elements corresponding to the red color filters 8R1 and 8R2. In the same manner, a lead pin 9G is connected to a back electrode of the photoelectric conversion element corresponding to the green color filter 8G, and a lead pin 9B is connected to back electrodes of the two elements corresponding to the blue color filters 8B1 and 8B2. A lead pin 9C is connected to transparent front electrodes of all of the photoelectric conversion elements 6. The common lead pin 9C and the lead pins 9R, 9G and 9B for the respective colors extend in the back face of the substrate 5. The back face of the photoelectric conversion device 4 thus formed is covered with a protection film 10 of epoxy resin or the like.

An IR cut-off filter 11 for cutting off light in a wavelength region of more than about 700 nm and an UV cut-off filter 12 for cutting off light in a wavelength region of less than about 400 nm are disposed on the front face of the photoelectric conversion device 4 and only light in the visible region is permitted to enter the photoelectric conversion device 4. In the following, a framing of the thus structured color sensor will be described.

Figure 3:
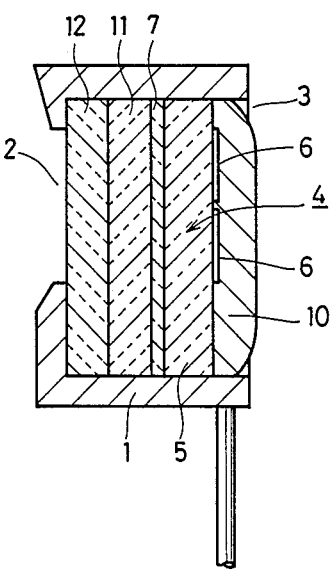
FIG. 3 is a sectional view taken along the line A—A in FIG. 1.
Figure 4:
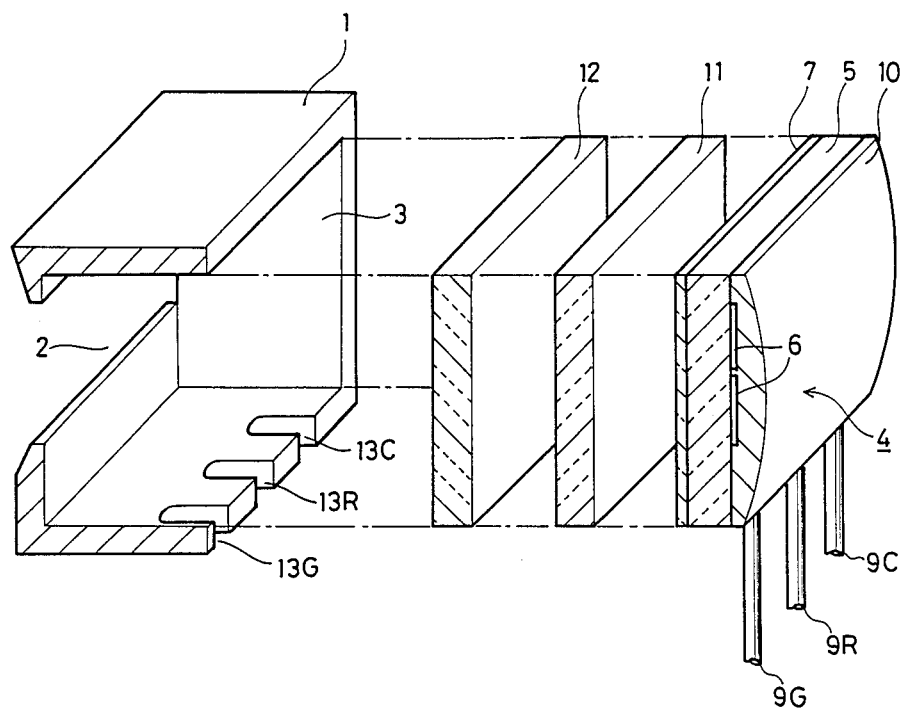
FIG. 4 is a perspective exploded view corresponding to FIG. 3.
Figure 5:
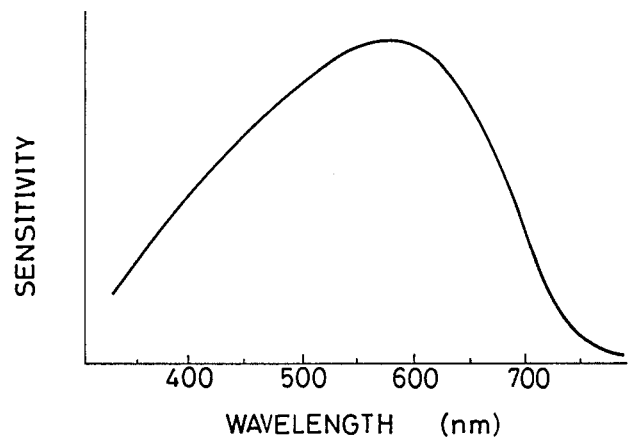
FIG. 5 is a graph showing a spectral sensitivity characteristic of a photoelectric conversion device using amorphous silicon.

As can be seen in FIG. 4, first of all, the UV cut-off filter 12, the IR cut-off filter 11 and the photoelectric conversion device 4 are fitted in this order in the shielding frame 1 through the back entrance 3. As a result, as shown in FIG. 3, the cut-off filters 12 and 11 are pressed against the window 2 by the photoelectric conversion device 4. Notches 13C, 13R, 13G and 13B for receiving the lead pins 9C, 9R, 9G and 9B, respectively, of the photoelectric conversion device 4 are provided in a peripheral portion of the back entrance 3 of the frame 1. Those notches may be formed to have a sufficient depth so that the frame 1 can be used commonly for the photosensor not requiring the cut-off filters 11 and 12.

Figure 2:
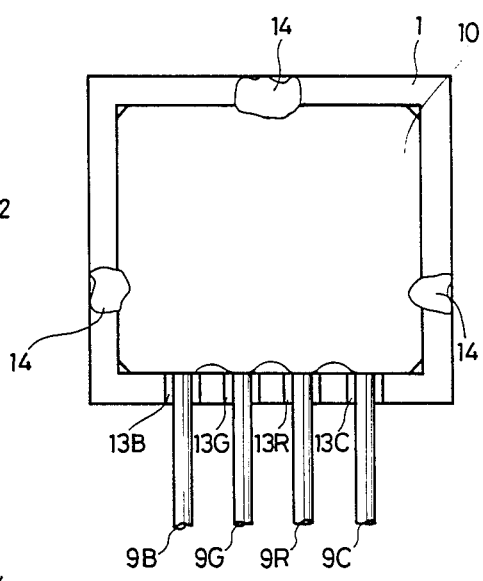
FIG. 2 is a back view of the color sensor shown in FIG. 1.

The photoelectric conversion device 4 inserted as described above is not fixed mechanically to the frame 1. Therefore, as shown in FIG. 2, stop portions 14 are formed by deforming the surrounding end portion of the back entrance of the frame 1 by using a heating bar such as a soldering iron. Stop portions 14 contact the protection film of the photoelectric conversion device 4 so that the photoelectric conversion device 4 is fixed in the frame 1. Thus, the cut-off filters 12 and 11, and the photoelectric conversion device 4 are fixed in the frame 1 in close contact with one another.

In the thus framed photoelectric conversion device 4, light can be prevented from penetrating into the photoelectric conversion elements 6 not only from the narrow lateral faces of the support substrate 5 parallel to the thickness direction thereof but also from the lateral faces of the cut-off filters 11 and 12. In addition, it is not needed to fix the cut-off filters 11 and 12 to the photoelectric conversion device 4 by an adhesive agent.

Results of a heat cycle test and a humidity test for a conventional photoelectric conversion device having an UV cut-off filter and an IR cut-off filter adhered as described above and those for a framed photoelectric conversion device of the above described embodiment will be described in the following. In the heat cycle tests, the respective photoelectric conversion devices were subjected to temperature change in a range from $-20°$ C. to $80°$ C. for four hours for one cycle, the temperature being maintained at $-20°$ C. and at $80°$ C. respectively for 30 minutes, and thus five cycles were repeated. In the humidity tests, the photoelectric conversion devices were kept in an atmosphere at humidity of 95% at $40°$ C. for 500 hours.

After the above described heat cycle test and humidity test, it was found that damage such as breaking of the cut-off filters 11 and 12 did not occur in the framed photoelectric conversion device in the above described embodiment. On the other hand, the conventional photoelectric conversion device could not pass the two tests although the results of the tests depended on the utilized adhesive agents (such as those of an an epoxy system, an acryl system or a silicone system). Particularly, damage occurred frequently in the IR cut-off filter and it was found particularly in the humidity test that bubbles were generated between the filters, causing a local change in the reflectance with respect to incident light.

Although in the above described embodiment, the stop portions 14 are formed by thermal deformation of the surrounding end portion of the back entrance in the frame 1 formed of thermoplastic resin thereby to fix the photoelectric conversion device 4, the photoelectric conversion device 4 may be fixed at one or more points in the surrounding end portion of the back entrance by means of an adhesive agent. Such fixing of the photoelectric conversion device to the frame 1 by means of the adhesive agent is not preferred from a viewpoint of doing rapid work but it is preferred from a viewpoint of assuring fixing strength.

Although the frame of thermoplastic resin is used in the above described embodiment, a metallic frame molded by press working may be used. If a metallic frame having projections in the surrounding end portion of the back entrance 3 is used, the photoelectric conversion device 4 can be fixed by bending such projections after it has been fitted in the frame.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photosensor comprising
   a light shielding frame having a front window and a back entrance, and
   a photoelectric conversion device including a transparent substrate on a front face of said device,
   said photoelectric conversion device being fitted in said frame through said back entrance to cause said substrate to face said window, and said photoelectric conversion device being fixed by one or more stop portions formed by deformation of a surrounding end portion of said back entrance.

2. A photosensor in accordance with claim 1, wherein said frame is formed of a thermoplastic resin and said stop portions are formed by thermal deformation.

3. A photosensor in accordance with claim 2, wherein said photoelectric conversion device is further fixed at one or more points of the surrounding end portion of said back entrance by means of an adhesive agent.

4. A photosensor comprising
   a light shielding frame having a front window and a back entrance,
   a photoelectric conversion device including a transparent substrate on a front face of said device, and
   an optical cut-off filter,
   said filter being fitted in said frame through said back entrance,
   said photoelectric conversion device being fitted in said frame to cause said filter to be held between said substrate and said window, and
   said filter and said photoelectric conversion device being fixed by one or more stop portions formed by deformation of a surrounding end portion of said back entrance.

5. A photosensor in accordance with claim 4, wherein said filter cuts off light in an ultraviolet region.

6. A photosensor in accordance with claim 4, wherein said filter cuts off light in an infrared region.

7. A photosensor in accordance with claim 4, wherein said filter is a filter of a composite type for cutting off light in the ultraviolet region and light in the infrared region.

8. A photosensor in accordance with claim 4, wherein said filter is a bandpass filter for transmitting light in a specified wavelength region.

9. A photosensor in accordance with claim 4, wherein said frame is formed of a thermoplastic resin and said stop portions are formed by thermal deformation.

10. A photosensor in accordance with claim 9, wherein said photoelectric conversion device is further fixed at one or more points of the surrounding end portion of said back entrance by means of an adhesive agent.

11. A photosensor comprising
    a light shielding frame having a front window and a back entrance, and
    a photoelectric conversion device including a transparent substrate on a front face of said device,
    said photoelectric conversion device being fitted in said frame through said back entrance to cause said substrate to face said window and being fixed at one or more points of a surrounding end portion of said back entrance by means of an adhesive agent.

12. A photosensor in accordance with claim 11, wherein an optical cut-off filter is fitted in said frame so as to be held between said window and said substrate.

13. A photosensor in accordance with claim 12, wherein said filter cuts off light in the ultraviolet region.

14. A photosensor in accordance with claim 12, wherein said filter cuts off light in the infrared region.

15. A photosensor in accordance with claim 12, wherein said filter is a filter of a composite type for cutting off light in the ultraviolet region and light in the infrared region.

16. A photosensor in accordance with claim 12, wherein said filter is a bandpass filter for transmitting light in a specified wavelength region.

* * * * *